United States Patent
Tatemori et al.

(10) Patent No.: US 7,120,397 B2
(45) Date of Patent: Oct. 10, 2006

(54) ALL-FREQUENCY-BAND SSB RADIO COMMUNICATION SYSTEM AND RADIO APPARATUS

(75) Inventors: Masaki Tatemori, Setagaya-ku (JP); Yoji Makishima, 4-8-10, Higashi-cho, Nishi-tokyo-shi, 202-0012 (JP)

(73) Assignee: Yoji Makishima, Tokyo (JP)

( * ) Notice: Subject to any disclaimer, the term of this patent is extended or adjusted under 35 U.S.C. 154(b) by 843 days.

(21) Appl. No.: 09/934,870

(22) Filed: Aug. 21, 2001

(65) Prior Publication Data

US 2002/0025782 A1    Feb. 28, 2002

(30) Foreign Application Priority Data

Aug. 23, 2000 (JP) ............................. 2000-251864
May 25, 2001 (JP) ............................. 2001-157471

(51) Int. Cl.
H04B 1/68 (2006.01)
(52) U.S. Cl. ...................... 455/109; 332/115; 375/301; 455/203
(58) Field of Classification Search .................. 455/47, 455/180.2, 176.1, 136, 139, 137, 203, 109; 332/115, 149, 155, 159, 160, 170; 375/301
See application file for complete search history.

(56) References Cited

U.S. PATENT DOCUMENTS 3,100,871 A * 8/1963 Richardson et al. ........ 455/203
5,675,609 A * 10/1997 Johnson ...................... 375/237
6,741,646 B1 * 5/2004 Mohan et al. ............... 375/238

* cited by examiner

Primary Examiner—Wing Chan
Assistant Examiner—Olisa Anwah
(74) Attorney, Agent, or Firm—Hogan & Hartson LLP

(57) ABSTRACT

An SSB radio communication system and radio apparatus applicable to ultra high frequencies such as a VHF band and UHF band. In the transmitting side, a carrier wave is amplitude modulated by modulation input signals which comprise a constant amplitude, sine wave shaped reference pulse having a predetermined width and period and a sine wave shaped modulation pulse signal having an amplitude representing two- or multi-value digital values having the same width as the reference pulse signal and which are formed based on the amplitude of the reference pulse signal, and the modulated pulse signals are transmitted on a single side band, while in its receiving side the gain of received signals is automatically adjusted based on the reference pulse signal that is the value of the peak of the received signals. Further, in the transmitting side, the period or frequency of the reference pulse signal is also formed in synchronism with the carrier wave frequency, and in the receiving side, a local carrier wave frequency to be given to a demodulator is determined based on the period of frequency of the reference pulse signal.

6 Claims, 15 Drawing Sheets

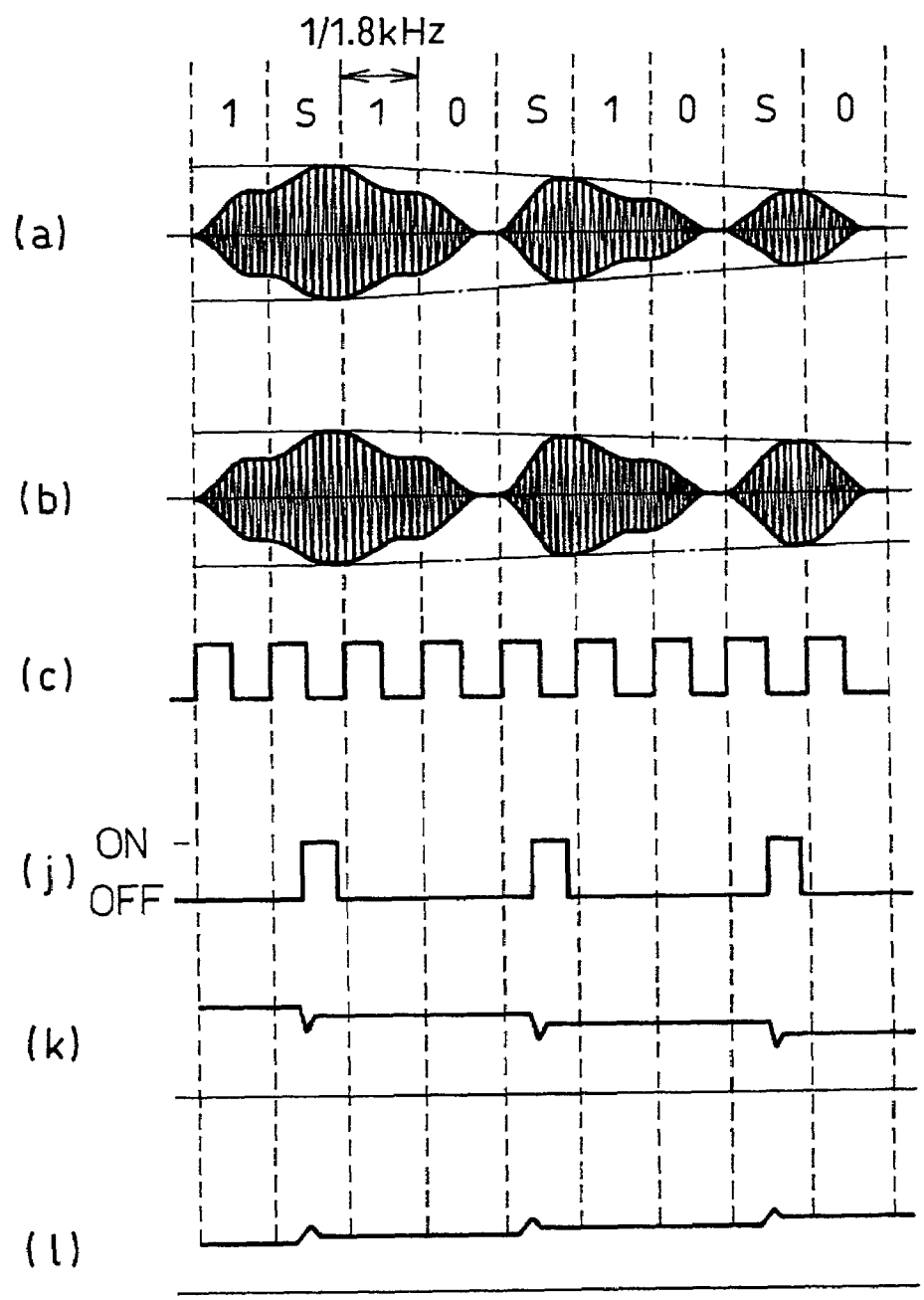

ALL-FREQUENCY-BAND SSB RADIO COMMUNICATION SYSTEM AND RADIO APPARATUS

FIELD OF THE INVENTION

This invention relates to an SSB radio communication system using a single side band (SSB) and radio apparatus therefor, particularly a radio system or apparatus which has advanced efficiency in using frequencies, and which is usable in ultra high frequency bands such as a VHF band, UHF band, and the like.

BACKGROUND OF THE INVENTION

An SSB radio communication system is widely used, wherein wireless communications are carried out by using amplitude modulation signals.

In this SSB radio communication system, a carrier wave and one of upper and lower side band waves that do not contribute directly to the transmission of information are suppressed, and only either one of the upper and lower side band waves is transmitted. This system not only saves electric power but also can use a number of communication channels by using only a half the frequency band.

FIG. 1 shows a block diagram of a receiving circuit for a radio apparatus using the conventional SSB radio communication system.

In FIG. 1, an antenna 11 receives single side band signals transmitted from the transmitting side, and a high frequency amplifier 12 amplifies the received signals. A frequency converter 13 mixes the single side band signals from the high frequency amplifier 12 and a signal from a local oscillator 14, and converts the mixed signals through a band limiting filter 15 into intermediate frequency signals. In an intermediate frequency amplifier 16, the gain of the converted signals is automatically adjusted by a detector 17 so as to give an output of a predetermined value. In a demodulator 18, the automatically gain adjusted intermediate signals are demodulated based on a signal from a local carrier wave oscillator 19. The output signals of the demodulator 18 are passed through a low pass filter 20 and amplified by a low frequency amplifier 21 to obtain demodulated output signals.

However, since in this SSB radio communication system there is no reference carrier wave signal serving as a reference for adjusting a level when an automatic gain adjustment is carried out in the intermediate frequency amplifier 16 and detector 17 of FIG. 1, the time constant in the automatic gain adjustment needs to be made sufficiently longer than the period of the modulated signals. For this reason, when the level of the received signals changes, depending on the conditions of a radio communication path, at a period shorter than that in the automatic gain adjustment, an amplitude distortion will be generated in the receiving circuit so that the received output changes.

In addition, to completely recover the waveforms of the modulated signals, it is needed that a frequency which causes frequencies in the transmitting and receiving sides to coincide must be fed to the frequency converter 13 and demodulator 18 from the local oscillator 14 and local carrier wave oscillator 19, respectively. Even if a little error is allowable, a frequency within the allowable range must be supplied. Thus, to coincide frequencies in the transmitting and receiving sides a high stable oscillator is required. When there is no such a high stable oscillator, for example, a circuit (clarifier) for finely adjusting the frequency in the receiving side will be needed.

Further, since in the SSB radio communication system the output level of the received signal changes depending on the conditions of a radio communication path, it is difficult to handle the values of amplitudes as the values of modulated digital signals so that the efficient transmission of data is impossible.

SUMMARY OF THE INVENTION

It is an object of the present invention to provide an SSB radio communication system and radio apparatus that can instantaneously and high accurately carry out the automatic gain control of receiving circuits, independently of the conditions of a radio communication path, by using the advantages of high electric power efficiency and narrow frequency band transmission in the SSB radio communication system. It is also a further object to provide an SSB radio communication system and radio apparatus that are usable in ultra high frequencies such as a VHF band, UHF band, and the like.

It is another object of the present invention to provide an SSB radio communication system and radio apparatus that require no high stable oscillator and no circuit (clarifier) for finely adjusting the frequency in the receiving side by creating a frequency synchronized with that in the transmitting side based on received signals.

It is a further object of the present invention to provide an SSB radio communication system and radio apparatus that allow them to handle the values of amplitudes as the values of modulated digital signals and efficiently transmit data even if the levels of the received output signals change depending the conditions of a radio communication path.

In the transmitting side of the SSB radio communication system of this invention, a carrier wave is amplitude modulated by modulation input signals that comprise a constant amplitude, sine wave shaped reference pulse signal, having a predetermined width and period, and a sine wave shaped modulation pulse signal, having an amplitude representing two- or multi-value digital values having the same width as the reference pulse signal, and are formed based on the amplitude of the reference pulse signal, and the amplitude modulated signals are transmitted by a single side band. In its receiving side, the gain of received signals is automatically adjusted based on the reference pulse signal that shows the value of the peak of the received signals.

In the transmitting side, the period or frequency of the reference pulse signal is formed in synchronism with the carrier wave frequency, and in the receiving side, a local carrier wave frequency to be given to a demodulator is determined based on the period of frequency of the reference pulse signal.

The transmitting side of the radio apparatus of this invention comprises a transmitting circuit for single side band communications and means for generating modulation inputs, wherein both a constant amplitude, sine wave shaped reference pulse signal with a predetermined width and period, and sine wave shaped modulation pulse signals that represent two- or multi-values of digital signals, and that are formed by using the width which is the same as the reference pulse signal, and by using the amplitude of the reference pulse signal as a reference are generated. The modulation signals generated by the modulation inputs generating means are supplied to the transmitting circuit so that the carrier wave is amplitude modulated so as to be transmitted by a single side band.

The reference pulse signal is formed such that the reference pulse signal is provided with a predetermined width and a predetermined period based on the carrier wave frequency of the transmitting circuit.

The receiving side of the radio apparatus of this invention comprises a receiving circuit, having an intermediate frequency amplifier for receiving communication signals carried by a single side band, and for automatically controlling the gain of the received signals, a demodulator for demodulating the received signals based on a local carrier wave frequency, and gain control means for automatically control the gain of the intermediate frequency amplifier such that a sine wave shaped reference pulse signal, which is contained in the output signals of the intermediate frequency amplifier, and which has a predetermined width and a predetermined period, is peak detected so that its peak value becomes a predetermined value.

The reference pulse signal which is contained in the output signals of the intermediate frequency amplifier is peak detected to extract a row of constant period pulse signals, and wherein the local carrier wave frequency to be added to the demodulator is adjusted based on the row of constant period pulse signals.

A low frequency amplifier is disposed in the latter stage of the demodulator, wherein the gain of the low frequency amplifier is controlled by the automatic gain control means based on the reference pulse signal contained in the output signals of the low frequency amplifier.

The receiving side of the radio apparatus of this invention comprises receiving single side band communication signals modulated by modulation input signals, the modulation input signals comprising a constant amplitude, sine wave shaped reference pulse signal, formed based on a carrier frequency, having a predetermined width and a predetermined period, and sine wave shaped modulation pulse signals having the same width as the reference pulse signal and amplitudes representing two- or multi-value digital values based on the amplitude of the reference pulse signal, and providing a receiving circuit comprising an intermediate frequency amplifier for automatically control the gain of the modulated signals and a demodulator for demodulating the received signals, characterized by automatic gain control means for peak detecting the reference pulse signal contained in the output signals of the intermediate frequency amplifier, and for controlling the gain of the intermediate frequency amplifier so that its peak value becomes a predetermined value, and amplitude detector means for amplitude detecting the output of the intermediate frequency amplifier to extract a frequency component of the predetermined period of the reference pulse signal, wherein the frequency obtained based on the frequency obtained by the amplitude detector means is mixed with the frequency of the output signal of the intermediate frequency amplifier, and a frequency representing the sum or difference therebetween is fed to the demodulator as a local carrier frequency wave.

The radio apparatus has a condenser having a charging/discharging circuit to control the gain of the intermediate frequency amplifier according to a charging voltage, wherein the discharging circuit of the condenser is switched on during a period when the amplitude of the reference pulse signal increases, and switched off during at least a period of the modulation pulse signals.

This invention can instantly and accurately carry out the automatic gain control of the receiving circuit independently of the conditions of a radio communication path by using the advantages of high power efficiency and narrow frequency band transmission in the SSB radio communication system.

Since the carrier wave is amplitude modulated through a single frequency by using the constant amplitude sine wave shaped reference pulse signal and sine wave shaped modulation pulse signals, and since the modulation pulse signals have amplitudes having the same width as that of the reference pulse signal and representing digital values to transmit them by a single side band, it needs only a very narrow frequency band. Thus, efficiency of using frequencies is greatly enhanced.

Since the gain of the intermediate frequency amplifier is automatically controlled every interval between received pulse signals, even if the levels of received signals change depending on the conditions of a communication path, the demodulated output is kept constant with little generation of amplitude distortions.

Especially, since multi-value digital signals based on the amplitude of the reference pulse signal can be handled as modulation values by automatically controlling the gain every interval of the received pulse signals, the efficiency of transmitting data is improved.

Since the local oscillation frequency can be controlled by synchronizing it with the interval or frequency between received reference pulse signals, a high stable oscillator is not needed. No circuit (clarifier) is needed to finely adjust the received frequency in the receiving side.

Since the synchronous demodulator is also used, unnecessary components such as noises are reduced in the output of the demodulator. Since the frequency of modulation signals is constant, a further band pass filter circuit can be disposed in the latter stage of the demodulator to remove unnecessary components, and the low frequency amplifier can also be disposed to readjust the gain by a peak detector mode. Thus, the unnecessary components such as noises can be further reduced to output signals having predetermined amplitudes.

The discharging circuit of the condenser for controlling the gain of the intermediate frequency amplifier is switched on during the period where the value of amplitudes of the constant pulse signal increases, and is switched off at least during the period of modulation signals. Thus, since the AGC voltage is created based on input signals during the period of the reference signal, and since the AGC voltage is thus kept constant during the period of data signals, the gain can be appropriately controlled.

Single side band communication signals modulated by modulation inputs, which comprise a constant amplitude, sine wave shaped reference pulse signal, formed based on the carrier frequency, having a predetermined width and a predetermined period, and sine wave shaped modulation pulse signals having the same width as the reference pulse signal and amplitudes representing two- or multi-value digital values based on the amplitude of the reference pulse signal, are received to control the gain, and to demodulate the modulated signals. In this time, the repeated frequency components of the reference pulse signals contained in the output signals of the intermediate frequency amplifier are extracted, and the synchronous detector operation in the demodulator can be carried out without any error by using the frequency as a reference frequency for demodulation.

The repeated frequency components of the reference pulse signals are constant, even if the received input frequency has been shifted up or shifted down by the mixing circuit, independently of the local oscillation frequency or the frequency of the intermediate frequency amplifier extracted by it. Thus, in the VHF band or UHF band where frequencies are liable to be shifted, the frequency of the local oscillator or local carrier wave oscillator can also be easily controlled. Thus, it can be used without any problem in a VHF band or UHF band.

For example, it is assumed that the frequency of the modulation comprising the reference pulse signal and data signals is 4,8 kHz, the pass band width is 2.4 kHz, the number of data signals between the reference pulse signals is two, and the number of multi-values is eight. In this case, the transmission speed of data is 4.8 (kHz)×2/3 (number of data signals)×3 (number of multi-values $8=2^3$). Thus, high speed data transmission can be made by such a narrow band.

As stated above, this invention can apply the SSB radio communication system and radio apparatus to ultra high frequencies such as a VHF band or UHF band, and thus the efficiency of using frequencies such as a VHF band or UHF band and the like can be greatly improved.

BRIEF DESCRIPTION OF THE DRAWINGS

FIG. 15 is a diagram showing the waveforms of each part of FIG. 13.

DETAILED DESCRIPTION OF THE PREFERRED EMBODIMENTS

Figure 2:
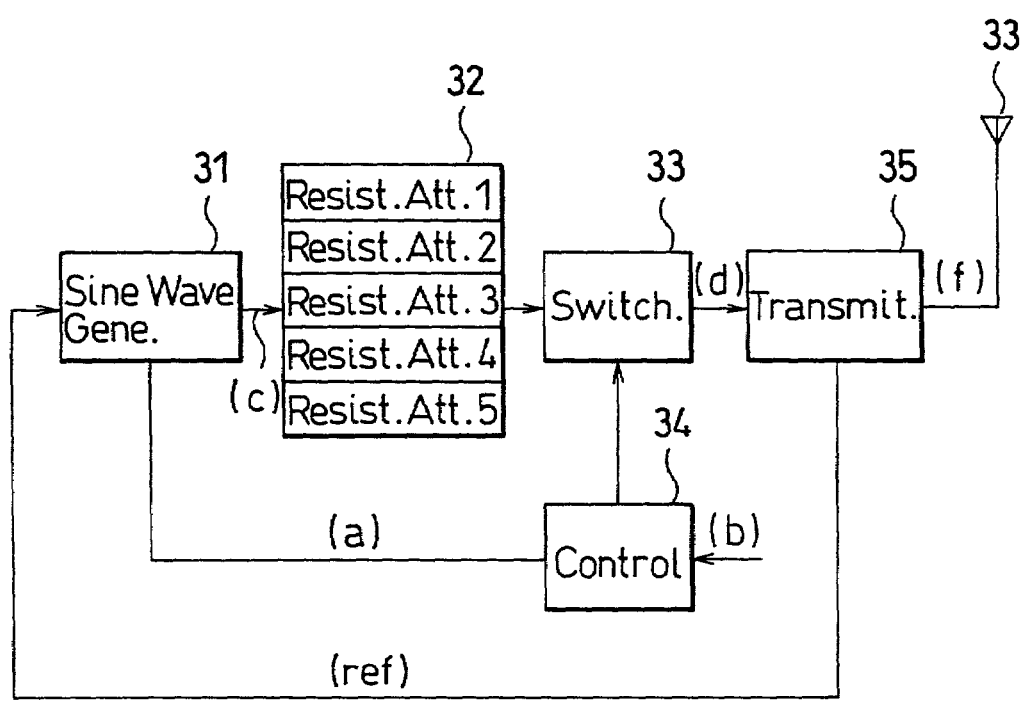
FIG. 2 is a schematic showing the whole structure of the transmitting side of a radio apparatus of the SSB radio communication system of this invention.
Figure 3:
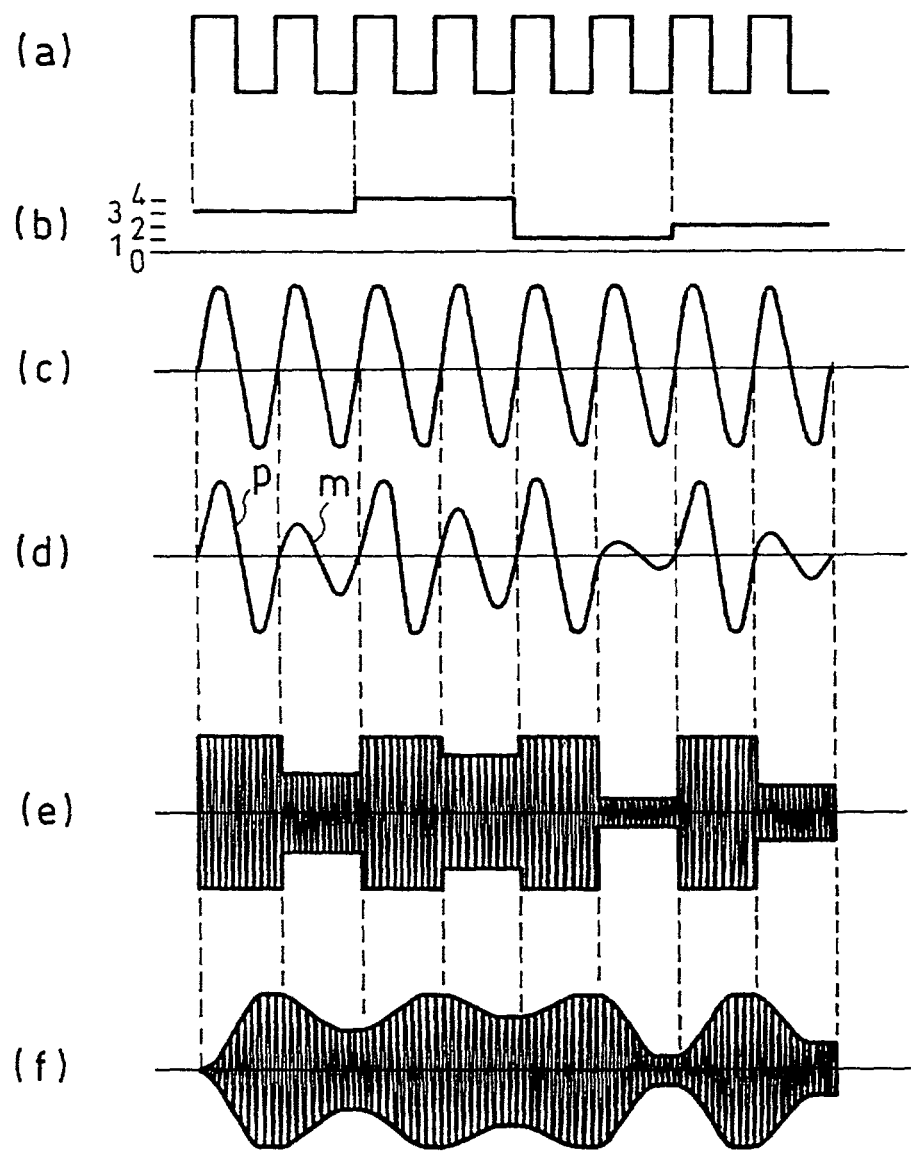
FIG. 3 is a diagram showing the waveforms of signals in each part of FIG. 2.

FIG. 2 is a schematic showing the whole structure of the transmitting side of an embodiment of the radio apparatus of the SSB radio communication system of this invention. FIG. 3 is a diagram showing the waveforms of signals in each part of FIG. 2.

In this embodiment, wherein multi-values (four values) of digital signals are transmitted, a clock signal frequency of 1.8 kHz used as only a modulation frequency synchronized with a carrier wave is selected, signals are carried on each value of its amplitude per its cycle, a reference signal with the largest constant amplitude and constant interval is placed in one of the signals, and one data signal is inserted therebetween (a plurality of data signals may also be inserted).

In FIG. 2, a sine wave generator 31 receives from a transmitting circuit 35 a reference signal (ref) based on its carrier wave frequency, and both a clock signal (a) of 1.8 kHz, having a constant amplitude and a duty ratio of 50%, and a sine wave signal (c) of 1.8 kHz are outputted to be fed to a resistance attenuator part 32. The resistance attenuator part 32 consists of five resistance attenuators 1–5 to correspond to both the reference signal and the four values of data signals.

Each output from the resistance attenuator part 32 is inputted to a switching circuit 33. On the other hand, in a control circuit 34, modulation data is formed in response to digital data (b) and the clock signal (a) of 1.8 kHz so as to be fed to the switching circuit 33. In the switching circuit 33, based on modulation data, the output from a resistance attenuator part 32 is switched to output a reference signal (hereafter referred to as a reference pulse signal p) and data signals 1–4 (hereafter referred to as modulation pulse signals m). The reference pulse signal is formed such that it becomes a constant amplitude sine wave shape having a predetermined width and a predetermined period or cycle. The modulation signals m are sine wave shaped modulation pulse signals m that have amplitudes representing multi-values of digital signals formed by using the width that is the same as that of the reference pulse signal and the amplitude of the reference pulse signal as a reference.

The output (d) of the switching circuit 33 is fed to the transmitting circuit 35 as modulation signals whose values of amplitudes change per cycle of the sine wave of 1.8 Hz. In the transmitting circuit 35, the carrier wave is modulated by modulation signals (d), the modulated waves (only upper side band waves (e)) are filtered by a band pass filter circuit, and, for example, side band waves on the upper frequency side are outputted as SSB modulated waves f. Since the output of the transmitting circuit 35 (only upper side band waves) is passed through the band pass filter circuit, delays in rising and falling parts are produced according to the bandwidth. However, the peak of the amplitude is the same as that of the input, and the output has a value of amplitude according to each amplitude of the sine wave shaped modulated signals at that time.

Figure 4:
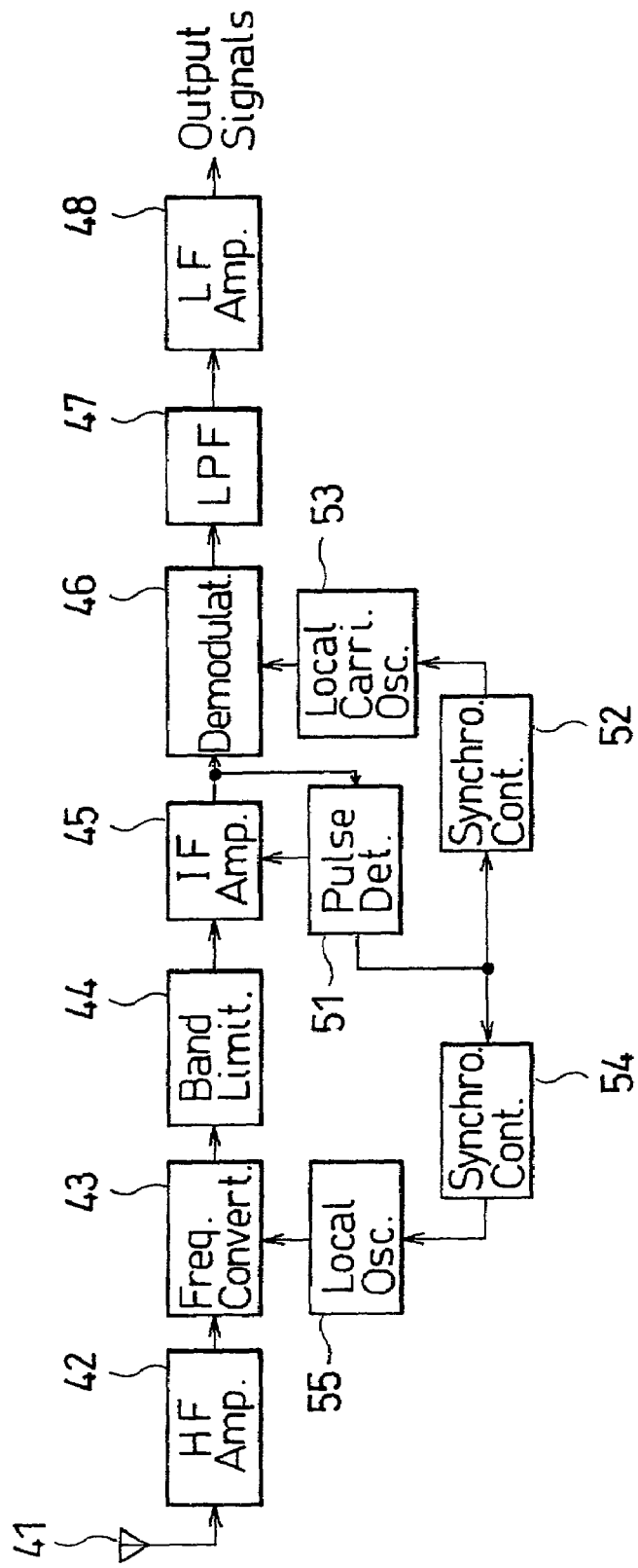
FIG. 4 is a general view showing the whole structure of the receiving side of a radio apparatus of the SSB radio communication system of this invention.
Figure 5:
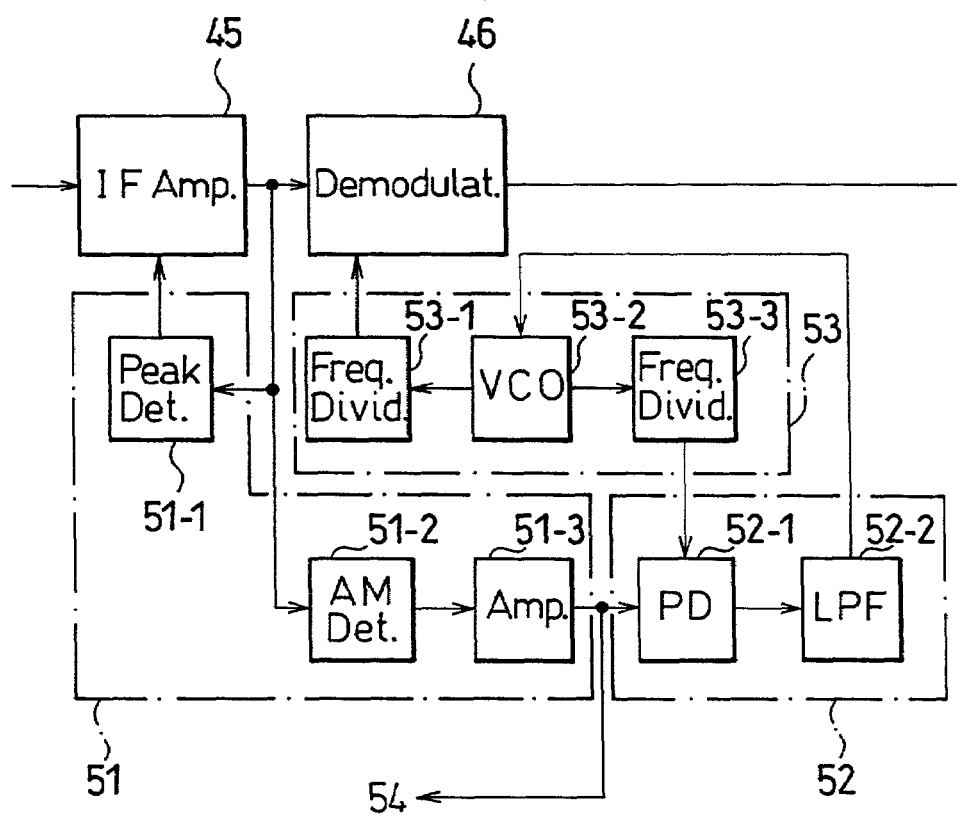
FIG. 5 is a diagram showing specific circuits in the receiving side of FIG. 4.

FIG. 4 is a general view showing the whole structure of the receiving side of an embodiment of the radio apparatus of the SSB radio communication system of this invention, and FIG. 5 is a diagram exemplifying specific circuits in the receiving side of FIG. 4.

Figure 1:
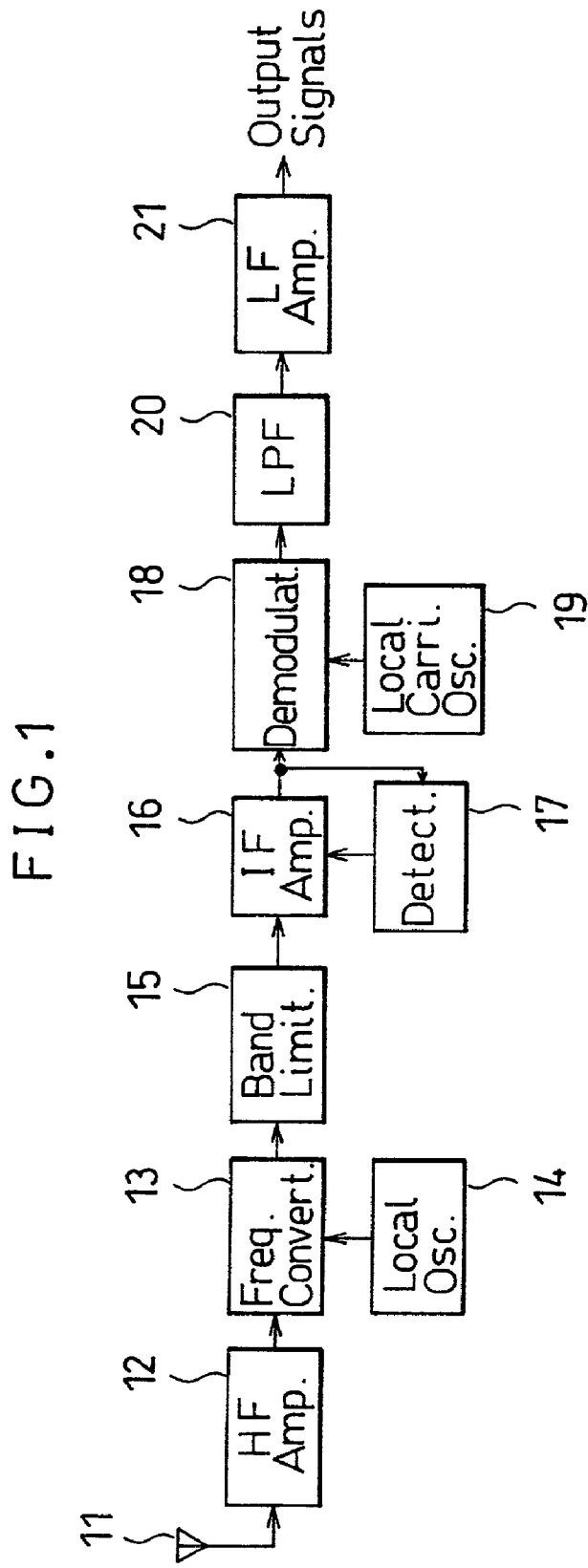
FIG. 1 is a block diagram showing receiving circuits of a radio apparatus using the conventional SSB radio communication system.

An antenna 41, a high frequency amplifier 42, a frequency converter 43, a band limiting filter 44, an intermediate frequency amplifier 45, a demodulator 46, a low pass filter 47, a low frequency amplifier 48, and the like, shown in FIG. 4 correspond to the antenna 11, high frequency amplifier 12, frequency converter 13, band limiting filter 15, intermediate frequency amplifier 16, demodulator 18, low frequency filter 20, low frequency amplifier 21, and the like, shown in FIG. 1, respectively.

In addition to the above components, this embodiment further consists of a pulse detector 51 which detects the reference pulse signal p from the output of the intermediate frequency amplifier 45, a local carrier wave oscillator 53 for generating variable frequencies, a synchronous controller 52 for adjusting the frequency of the local carrier wave oscillator 53 in synchronism with the frequency detected reference pulse signal p, a local oscillator 55 for generating variable frequencies, and a synchronous controller 54 for adjusting the frequency of the local oscillator 55 in synchronism with the frequency detected reference pulse signal p.

In the thus constituted receiving side of this embodiment, the signals transmitted by single side band which have been modulated by the reference pulse signal p and modulation signals m are received; the gain of the received signals are automatically controlled in the intermediate frequency amplifier 45, based on the reference pulse signal p having the constant amplitude and constant interval contained therein; frequencies of both the local oscillator 55 in the frequency converter 43 and of the local carrier wave oscillator 53 in the demodulator 46 are adjusted; and the demodulated signals are outputted from the demodulator 46.

In the circuit of FIG. 5, the output of the intermediate frequency amplifier 45 is fed to the pulse detector 51, and in the pulse detector 51, the reference pulse signal p, of which amplitude has been changed through the influence of fading and the like depending on the conditions of radio communication path, is peak detected by a peak detector 51-1.

Since the peak detected reference pulse signal p is passed by a constant cycle, it is feedback controlled so that the amplitude of the reference pulse signal p in the output of the intermediate frequency amplifier 45 becomes a predetermined value to automatically control the gain of the intermediate frequency amplifier 45. As a result, modulation signals m which have been amplified by the same ratio as that for the reference pulse signal p are inputted together with the reference pulse signal p having a constant amplitude and constant cycle to the demodulator 46. Thus, even if the amplitudes of the modulation signals have been changed by fading etc. in the transmitting path from the transmitting side, they can be recovered to the predetermined amplitude.

At the same time, in the pulse detector 51, the peak of the reference pulse signal p is detected in an AM detecting circuit 51-2, and amplified in an amplifier 51-3 to form a reference signal for comparing its phase. Since the interval of the reference pulse signal p has been determined, in the transmitting side, by means of a frequency division process and the like based on the carrier wave frequency of the transmitting circuit 35, it can be used as a reference frequency.

The local carrier wave oscillator 53, consisting of a frequency divider 53-1, a voltage control oscillator (VCO) 53-2, and a frequency divider 53-3, feeds a local carrier wave oscillating frequency to the demodulator 46 after dividing the oscillating frequency of the VCO 53-2, and it also feeds it as a comparison signal by dividing the oscillating frequency.

In the synchronous controller 52, a phase comparator 52-1 receives the peak interval of the reference pulse signal p from the AM detecting circuit 51-2 as a reference signal for making the phase comparison, and also it receives the divided output of the oscillation frequency of the VCO 53-2 as a comparison signal, for making the phase comparison, smoothes the difference (the frequency and the difference in phase) therebetween in a low pass filter (LPF) 52-2, and feeds the smoothed difference to the VCO 53-2 as a control signal.

A row of pulses of the reference pulse signals p detected in the pulse detector 51 is fed to the synchronous controller 54 so as to control the oscillation frequency of the local oscillator 55. Although the constitution of inside of the synchronous controller 54 and local oscillator 55 are not shown, they can be constituted similarly to those of the synchronous controller 52 and local carrier wave oscillator 53.

Thus, since the local oscillation frequency fed to the frequency converter 43 and the local carrier wave oscillation frequency fed to the demodulator 46 are phase-locked-loop (PLL) controlled so that both the former and latter frequencies have been made synchronous with those in the transmitting side, respectively, even if the frequencies in the transmitting side change, the frequencies in the receiving side will follow the change so that demodulation operations in the demodulator 46 which is constituted by a synchronous detector and the like will be appropriately carried out.

As stated above, the automatic control of the gain of the intermediate frequency amplifier 45 in the receiving circuit can be instantaneously and high accurately carried out by using the reference pulse signal p without any effect caused by the conditions of a radio communication path. Thus, since even if levels of received signals change, the gain of the intermediate frequency amplifier 45 is automatically adjusted in every interval of the received reference pulse signal p, the demodulated output can be kept constant so that the distorted amplitudes can hardly be generated.

Further, since local oscillation frequencies of both the local oscillator 55 and local carrier wave oscillator 53 can be adjusted by having them synchronized with carrier wave frequencies in the transmitting side, based on the interval (or frequency) of the received reference pulse signals p, even if carrier wave frequencies in the transmitting side change, the demodulator 46 can be operated without any hindrance.

Figure 6:
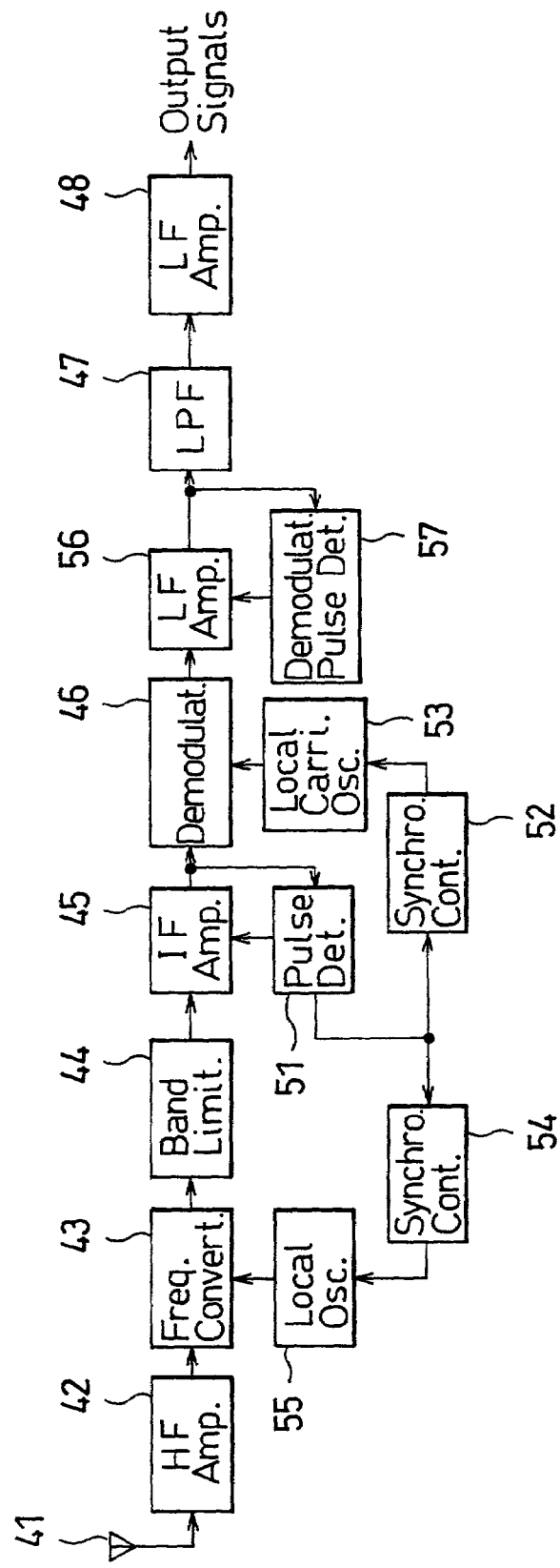
FIG. 6 is a general view showing the whole structure of the receiving side of another radio apparatus of the SSB radio communication system of this invention.

FIG. 6 is a general view showing the whole structure of the receiving side of another embodiment of the radio apparatus of the SSB radio communication system of this invention.

The constitution shown in FIG. 6 is similar to that of FIG. 4 except for that in the former a low frequency amplifier 56 and a demodulated output pulse detector 57 for automatically controlling a low frequency amplifier 56 is disposed between the demodulator 46 and the low frequency filter 47.

The demodulated output pulse detector 57 is for detecting the maximum value of the reference pulse signals p contained in the output signals of the low frequency amplifier 56 by, for example, peak detection. The peak detected reference pulse signal p is feedback controlled to automatically control the gain of the low frequency amplifier 56 so that the amplitude of the reference pulse signal p in the output of the low frequency amplifier 56 becomes the predetermined value.

Since in this repeated automatic gain control the gain of the receiving circuit is readjusted for the desired signal selected by the demodulator 46, the effects of unwanted components such as noise or the like may be reduced.

As stated above, in the transmitting side, multi-value digital signals are formed as modulated signals m by using the amplitude of the reference pulse signal p as a reference so that these reference pulse signals p and modulated multi-value digital signals m are used for transmission.

In the receiving side, multi-value digital modulated signals m are demodulated through gain control so that the received reference pulse signal p becomes a predetermined constant value.

According to the multi-value digital modulation, one can transmit data very efficiently by making the most use of the advantages of the high power efficiency and narrow frequency band transmission of the SSB radio communication system.

Since, in particular, in this system, the carrier wave is amplitude modulated with a single frequency by using a constant amplitude sine wave shaped reference pulse signal p and sine wave shaped modulation pulse signals m having amplitudes which have the same width as that of the reference pulse signal and which represent digital values, and the modulated signals are transmitted through a single side band, a very narrow frequency band suffices for the needed communications. Thus, the efficiency of using frequencies is greatly enhanced.

In the above described embodiment, the local oscillation frequency for the frequency converter and the local carrier wave oscillation frequency for demodulator are obtained by the PLL control based on the interval (or frequency) of the received reference pulse signal p. Since the PLL control can very accurately control frequencies, it can be used for carrier wave frequencies in a short wave band (3–30 MHz), even if some errors in frequency are generated by a delay of synchronous control for the variation of a carrier wave frequency or by error components caused by the remaining difference in the control.

The following embodiment enables the carrier wave to be accurately applied to the SSB radio communication system and SSB radio apparatus of this invention, even if it belongs to an ultra high frequency range such as a VHF or UHF band.

Figure 7:
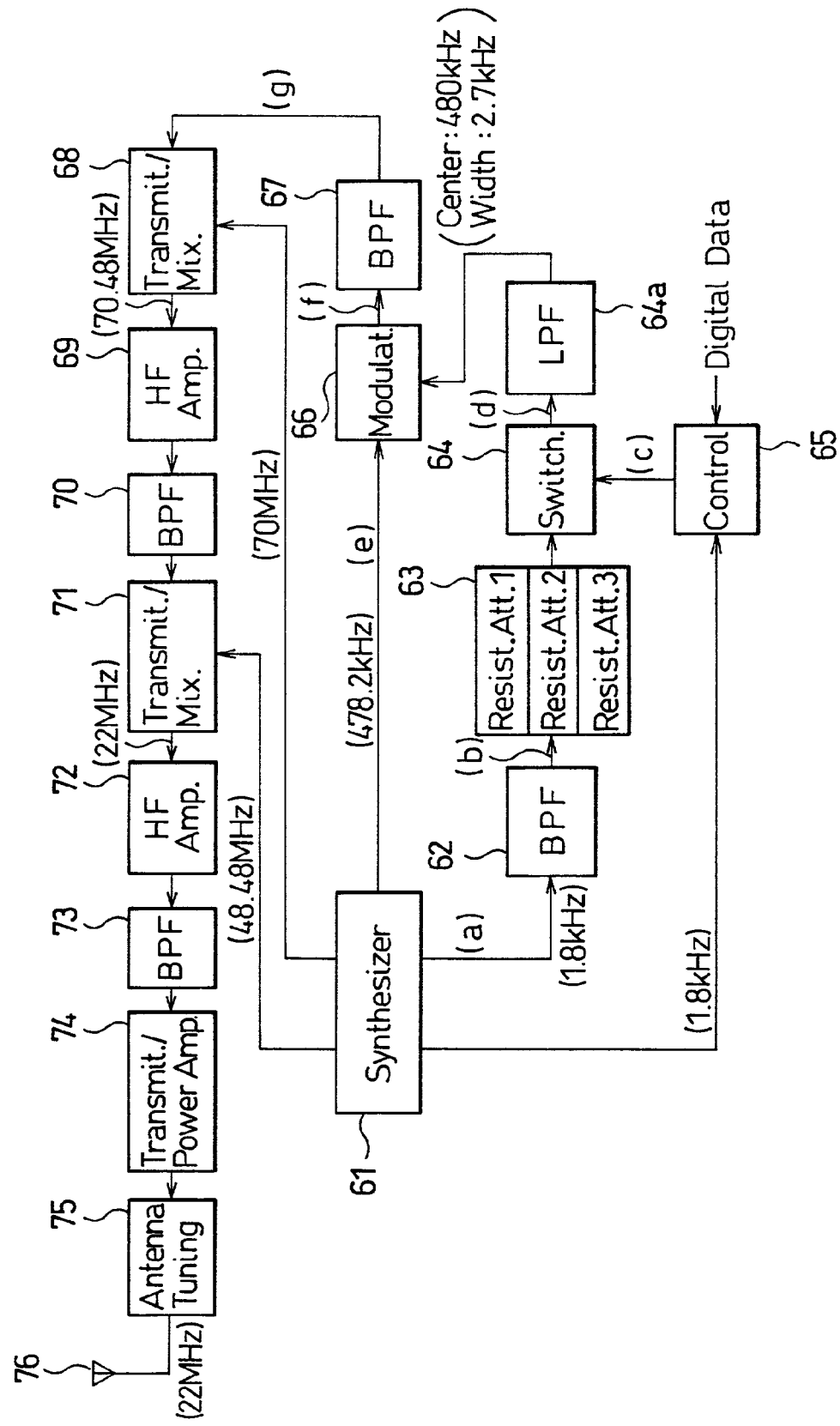
FIG. 7 is a general view showing the whole structure of the transmitting side of another embodiment of the radio apparatus of the SSB radio communication system of this invention.
Figure 8:
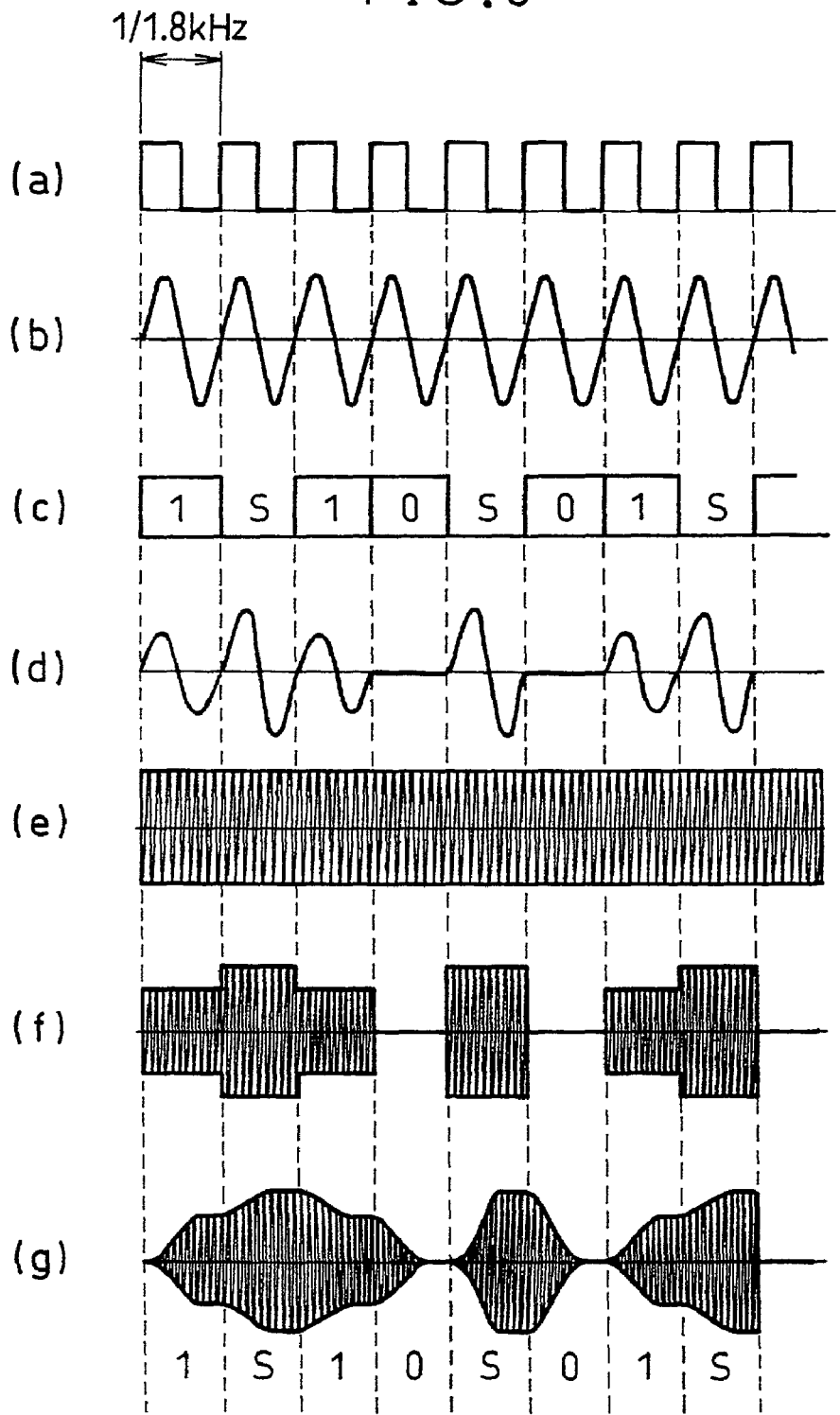
FIG. 8 is a diagram showing the waveforms of signals in each part of FIG. 7.
Figure 9A:
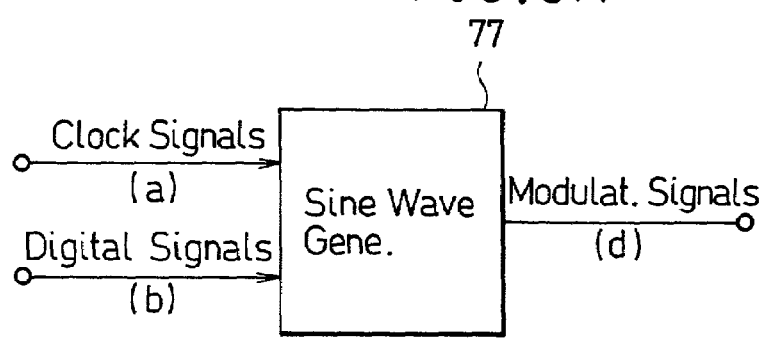
FIG. 9 is a diagram showing another means for forming modulation signals in the embodiment of FIG. 7.
Figure 9B:
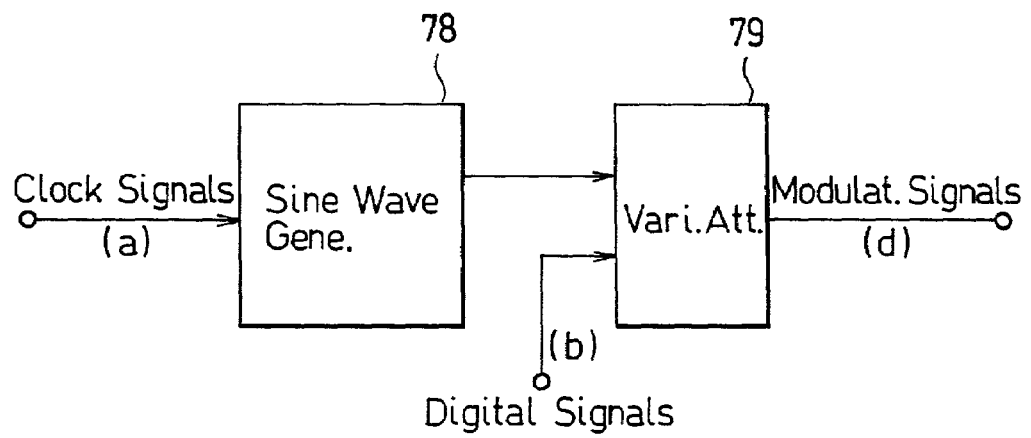
Figure 10:
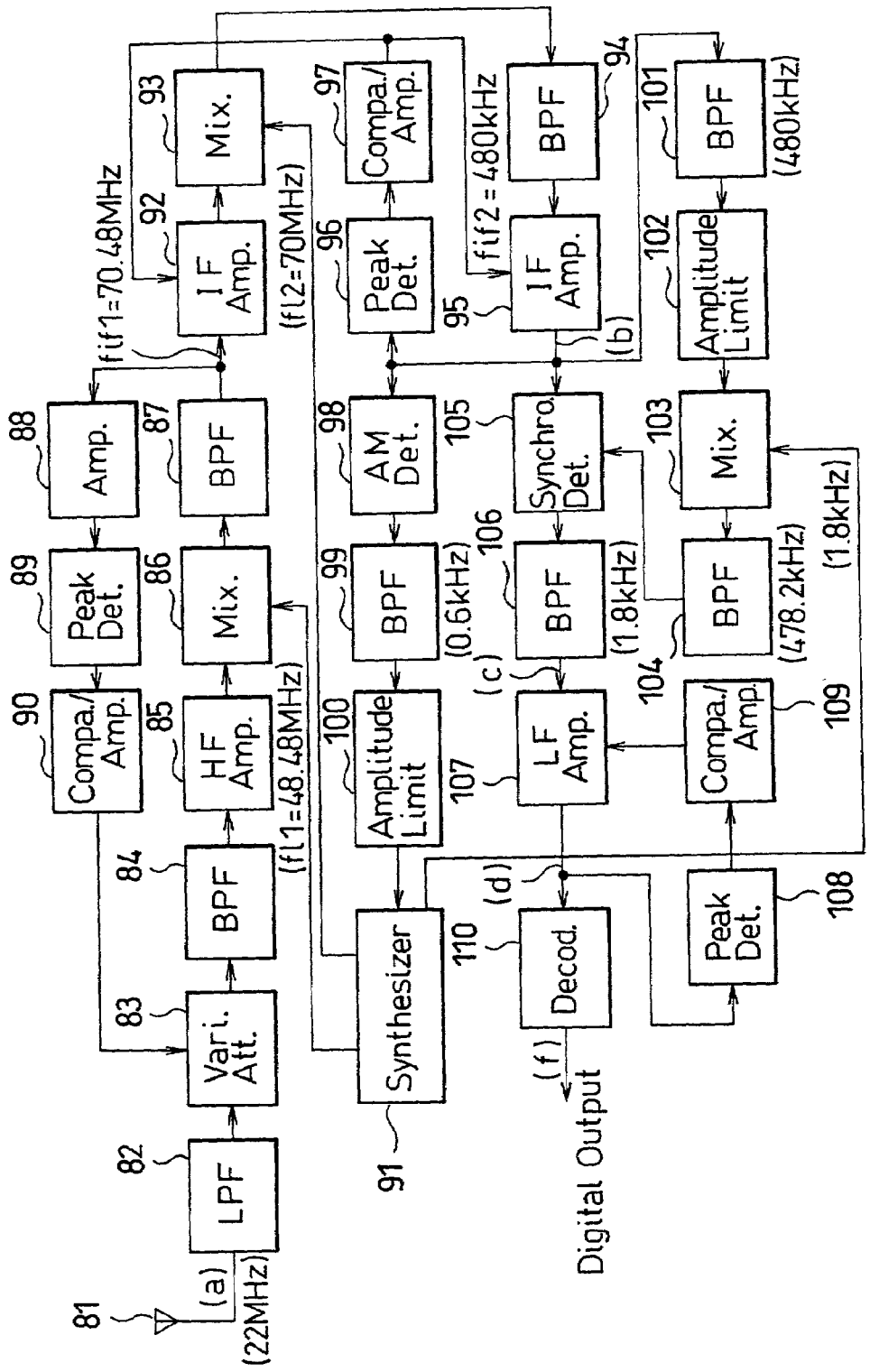
FIG. 10 is a general view showing the whole structure of the receiving side of a further embodiment of the radio apparatus of the SSB radio communication system of this invention.
Figure 11:
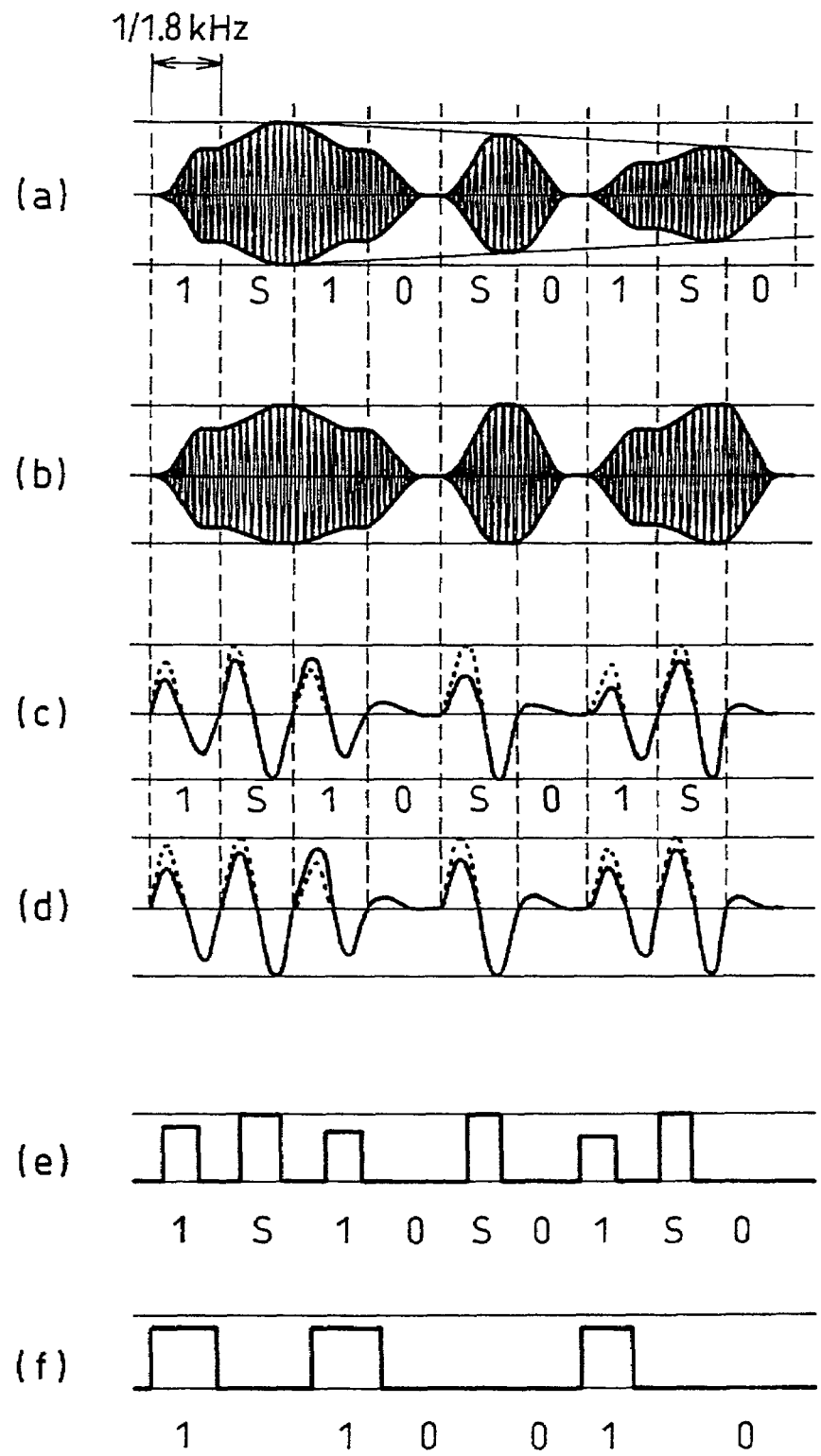
FIG. 11 is a diagram showing the waveforms of signals in each part of FIG. 10.

FIG. 7 is a general view showing the whole structure of the transmitting side of another embodiment of the radio apparatus of the SSB radio communication system of this invention, FIG. 8 is a diagram showing the waveforms of signals in each part of FIG. 7, FIG. 9 is a diagram showing another means for forming modulation signals, FIG. 10 is a general view showing the whole structure of the receiving side of the radio apparatus of the SSB radio communication system of this invention, and FIG. 11 is a diagram showing the waveforms of each part thereof.

In this embodiment which transmits multi-value of digital signals, a clock signal frequency of 1.8 kHz used as only one modulation frequency which is synchronized with a carrier wave is selected, signals are carried on values of its amplitudes per its cycle, a reference signal with the largest constant amplitude and constant interval is placed in one of the signals, and two data signals are inserted therebetween (one or another plurality of data signals may also be inserted).

The number of data signals to be inserted between the reference signals and the multi-value of digital data are determined by the pass band width, the minimum S/N, the circumstances of fading and the like that are created in the SSB radio communication system. For example, in the pass band width of 2.4 kHz, a reference signal of 4.8 kHz, two data signals and eight digital multi-values are affirmed.

In the receiving side, the reference signal is peak detected and the amplitude of the reference signal to be inputted to the demodulation circuit is made constant. Thus, changes in the amplitude of input signals caused by fading can be controllable so that the accuracy in the amplitude of the data signal incoming just after the fading can be enhanced.

Further, synchronous detecting operation in the demodulator can be conducted with no error by extracting a frequency component (0.6 kHz) of the reference signal contained in the output signal of the intermediate frequency amplifier, and by using the frequency as a reference frequency for demodulation.

In FIG. 7, a synthesizer circuit 61 outputs a clock signal ((a) in FIG. 8) of 1.8 kHz having a constant amplitude and a duty ratio of 50%, an RF signal ((e) in FIG. 8) of 478.2 kHz for a modulation circuit, and mixing frequency signals of 70 MHz and 48.48 MHz, and a pulse signal of 1.8 kHz as well.

A band pass filter circuit 62, to which a clock signal (a) of 1.8 kHz having a constant amplitude and a duty ratio of 50% is inputted from synthesizer circuit 61, outputs a sine wave modulation frequency signal (b) so as to be fed to a resistance attenuator part 63. The resistance attenuator part 63 consists of three resistance attenuators 1–3 to correspond to the reference signal and data signals of two values. These data signals may be modified to multi-values such as four or eight values. In this case, the number of resistance attenuators is correspondingly changed to five or nine.

The output from the resistance attenuator part 63 is inputted to a switching circuit 64. On the other hand, a control circuit 65 forms modulation data (c) in response to digital data and the pulse signal of 1.8 kHz, and inputs the modulation data to the switching circuit 64. Based on the modulation data (c), the switching circuit 64 switches the output from the resistance attenuator part 63 and outputs the reference signal S and data signals (0,1) by respective sine waves.

In the embodiment, the reference signal having a constant value and the maximum amplitude and the data signals inserted between the reference signals are changed by fading. When it is assumed that the most severe reference for discrimination is ±1.5 dB, an error of about ±1.0 dB or less is preferable, and further that the shortest period of fading is 20 ms and it linearly decreases by 20 dB per a half period, the reference signal must be inserted by a period of 1.0 ms. Since 1/1.8 kHz=0.56 ms, the reference signal S must be inserted every two data signals. Of course the reference signal S may be inserted every one data signal, or three or more data signals may be inserted between the reference signals S depending on the conditions of modulation frequencies or fading.

The output (d) of the switching circuit 64 is given to a modulation circuit 66 as modulation signal, wherein the amplitude of the sine wave of 1.8 kHz changes every period, after noises liable to occur at the time of its switching have been removed through a low pass filter circuit 64*a*. Since in the modulation signal (d), a constant amplitude reference signal S is inserted every third period, a frequency component of 0.6 kHz is contained therein.

In the modulation circuit 66, RF signals (e) fed thereto are modulated by modulation signals (d), the modulated signals are filtered by a band pass filter circuit 67 having a center frequency of 480 kHz and a band width of 2.7 kHz, and upper side band waves are outputted as SSB modulated waves as shown in FIG. 8(*g*). Since the modulated output (only the upper side band) of the modulation circuit has a value of an amplitude corresponding to the amplitude of the sine wave shaped modulated signal at that time, as shown in FIG. 8(*f*), a frequency component of 1.8 kHz which is a frequency of clock signal and a frequency component of 0.6 kHz, which is derived by the constant amplitude reference signal S inserted every third period of the clock signal, are contained therein. Since the SSB modulated waves (g) are outputted through the band pass filter circuit 67, they are distorted at their rising and falling parts, which have been delayed according to the filter characteristics. Although the waveforms of the output (g) are distorted, in the latter half of each data section (at least on or after the beginning of the last quarter), the value of amplitudes corresponds to their original data (S, 0, 1). The band pass filter circuit 67 attenuates the carrier wave and lower side band by 90 dB from the maximum level of the upper side band.

The above mentioned operations will be arranged or represented by the following equation:

$$Vu = \tfrac{1}{2} \cdot mV_c \cos\{(W_c + p)t + \theta + \Psi\} \qquad (1)$$

where Vu=upper side band $V_c \cos(W_c t + \theta)$=modulation circuit RF signal (e)

$kA \cos(pt + \Psi)$=modulation signal (d)

$kA/V_c$=modulation degree (m), k=coefficient for the value of digital data.

Since amplitudes are changed every one cycle of the modulation frequency, the modulation degree of "m" changes every one cycle. This state is shown in FIG. 8 in waveforms (f) formed by envelopes. It is thought that the frequency spectra extend infinitely at points where the amplitudes of the outputs "f" change. The spectra are limited by means of the band pass filter circuit 67 to a range within the envelope such that delays are generated according to their band widths at the rising and falling parts thereof but the peaks of their amplitudes are kept unchanged as shown in FIG. 8 (g).

The SSB modulated waves (g) are mixed in a transmitting/mixing circuit 68 with a mixing frequency signal of 70 MHz, amplified in a high frequency amplifier circuit 69, and filtered through a band pass filter circuit 70 (a center frequency of 70.48 MHz). Further, they are mixed in a transmitting/mixing circuit 71 with a mixing frequency signal of 48.48 MHz, amplified in a high frequency amplifier circuit 72, filtered through a band pass filter circuit 73 (a center frequency of 22 MHz), amplified in a transmitting/power amplifier circuit 74, and transmitted via antenna tuning circuit 75 from an antenna 76 by a frequency of 22 MHz.

A sine wave signal generator 77, comprising a ROM and the like as is shown in FIG. 9A, for generating sine wave signals is used as means for forming modulating signals (d) such that sine wave signals can be digitally generated in response to a signal given an order to be inputted. In this case, a clock signal (a) (such as the signal similar to one shown in FIG. 8 (a)) and digital signals (b) (such as the digital data similar to ones shown in FIG. 7) are inputted to the sine wave signal generator 77, to generate modulating signals (d) (such as the signals similar to ones shown in FIG. 8 (d)) comprising sine wave signals having amplitudes corresponding to the values of digital signals (b) and a constant amplitude sine wave signal as a reference signal.

A sine wave signal generator 78, comprising a ROM and the like as is shown in FIG. 9B, for generating sine wave signals is used as means for forming modulating signals (d) with a variable attenuator 79 such that sine wave signals can be digitally generated in response to a signal given by the order to be inputted. In this case, modulating signals (d) may be outputted such that the clock signal (a) is inputted to the sine wave signal generator 78 to repeatedly generate a constant amplitude sine wave signal, the sine wave signal is fed to a variable attenuator 79, and attenuated there so that it has amplitudes corresponding to those values of digital data (b) inputted to the variable attenuator 79.

Figure 12:
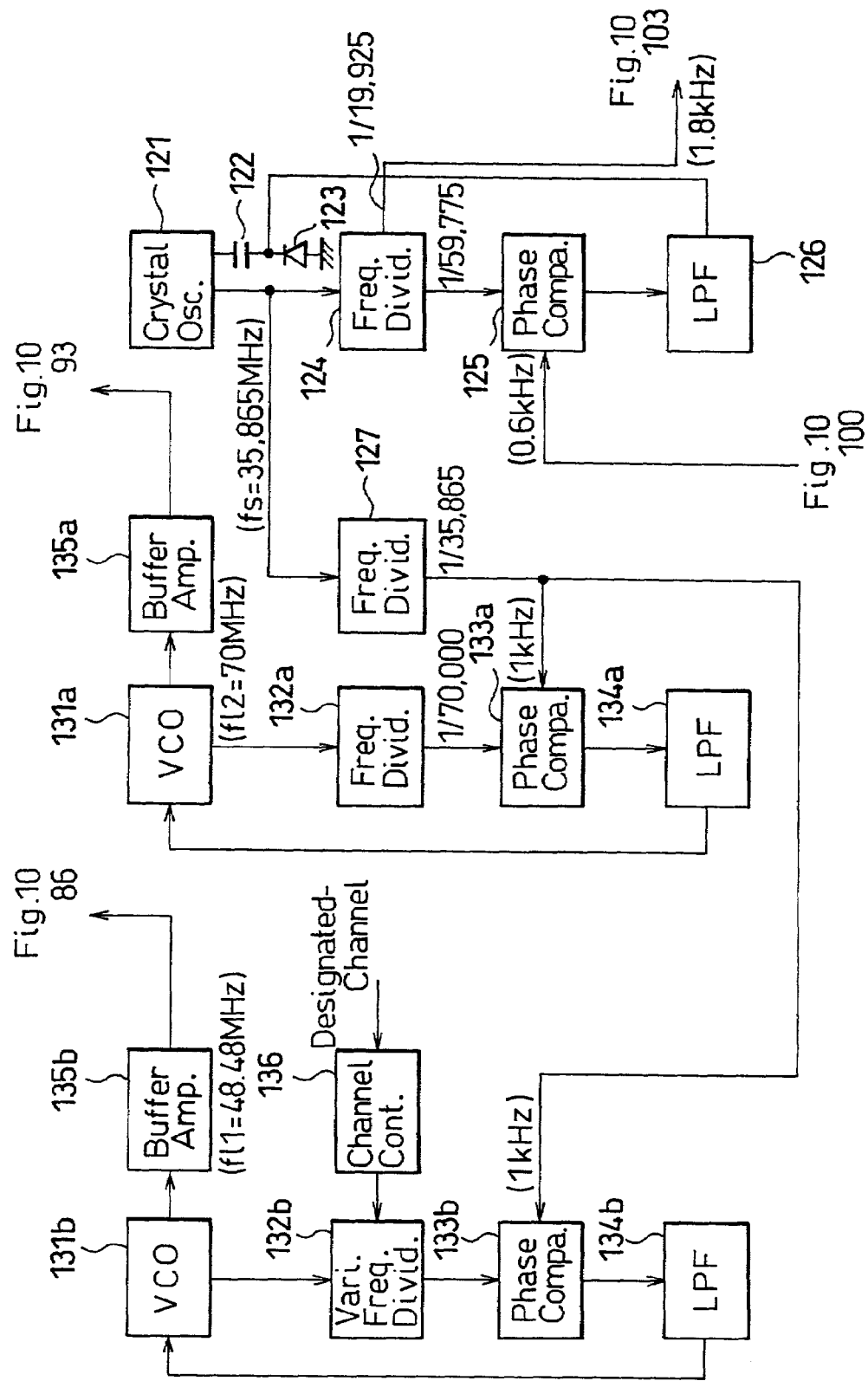
FIG. 12 is a block diagram showing the structure of a synthesizer used in the receiving side of a radio apparatus.

FIG. 10 is a general view showing the whole structure of the receiving side of a further embodiment of the radio apparatus of the SSB radio communication system of this invention. The radio apparatus is for receiving the SSB modulated signals transmitted from the transmitting side of the radio apparatus described in FIGS. 7 and 8. FIG. 11 is a diagram showing waveforms of signals in each part of FIG. 10. FIG. 12 is a block diagram showing the structure of a synthesizer used in the receiving side of FIG. 10.

Referring to FIGS. 10 and 11, it will now be explained the operations for receiving SSB modulated waves (center frequency of 22 MHz) that are transmitted from a radio apparatus in the transmitting side, and received through an antenna 81. The amplitudes of these received signals (a) would be changed as shown in FIG. 11 (a) when they have been affected by fading or the like in a transmission path.

After the high frequency component of the received signals (a) has been removed in a low pass filter circuit 82, the received signals (a) are attenuated in a variable attenuator 83 according to values given by the order, and then inputted to a mixing circuit 86 via a band pass filter circuit 84 and high frequency amplifier circuit 85. In the mixing circuit 86, the inputted signals and a first local signal frequency fl1 (=48.48 MHz) from a synthesizer circuit 91 are mixed to obtain, via a band pass filter circuit 87, a first intermediate frequency signal fif1 (=70.48 MHz).

After the first intermediate frequency signal fif1 has been amplified through an amplifier 88, the amplified frequency is peak detected by a peak detector circuit 89, compared with a predetermined value and amplified by a comparator/amplifier circuit 90, and the output is then used to control an attenuation amount of the variable attenuator 83. Because of this control of attenuation amount by feed back, the output value of the band pass filter circuit 87 is suppressed so as to keep it under a constant value so that it will not surpass the operating range of automatic gain control (AGC) carried out on and after the next step.

The first intermediate frequency signal fif1 is gain controlled by an intermediate frequency amplifier circuit 92, mixed by a mixing circuit 93 with a second local signal frequency fl2 (=70 MHz) from the synthesizer circuit 91, and filtered by a band pass filter circuit 94 so that it becomes a second intermediate frequency signal fif2 (=480 kHz).

After the second intermediate frequency signal fif2 (=480 kHz) has been automatically gain controlled and the change in amplitudes caused by fading has been reduced in an intermediate frequency amplifier circuit 95, it is fed to an AM detector circuit 98, a band pass filter circuit 101, and a synchronous detector circuit 105 serving as a demodulator.

Automatic control of gains in the intermediate frequency amplifier circuit 92 and intermediate frequency amplifier circuit 95 is carried out such that the second intermediate frequency signal fif2 (=480 kHz), an output signal from the intermediate frequency amplifier circuit 95, is peak detected by a peak detector circuit 96, the value of the detected peak is compared in a comparator/amplifier circuit 97 with a fixed reference value, and automatically control the gains of the intermediate frequency amplifier circuit 92 and intermediate frequency amplifier circuit 95 so that the peak value of the second intermediate frequency signal fif2 becomes the value of the constant amplitude. Thus, change in the value of the amplitude of the second intermediate frequency signal fif2 are greatly suppressed as shown in FIG. 11 (b), even if it has been affected by fading or the like.

The second intermediate frequency signal fif2 (b) has a frequency component of 0.6 kHz contained in its amplitude changes correspond to the reference signal S in the transmitting side. The inputted second intermediate frequency signal fif2 (b) is AM detected by the AM detector circuit 98, the AM detected output is fed to a band pass filter circuit 99 (center frequency of 0.6 kHz), the frequency component of 0.6 kHz is extracted, and is then fed to the synthesizer circuit 91 as a reference signal for oscillation control after its amplitude value has been adjusted by an amplitude limiting circuit 100.

The synthesizer circuit 91 generates, by means of the division of frequencies and the PLL control, the first local oscillation frequency fl1 (48.480 MHz), the second local oscillation frequency fl2 (70 MHz), and the frequency signal of 1.8 kHz, based on the frequency of 0.6 kHz as a reference signal.

Since the frequency of 0.6 kHz, which is serves as a reference signal, in the AM detected output is a frequency synchronized with the clock frequency (1.8 kHz) in the transmitting side, the frequency signal of 1.8 kHz generated from the synthesizer circuit 91 has been almost completely synchronized with the clock signal in the transmitting side. The completely synchronized frequency signal of 1.8 kHz can be obtained, if necessary, by multiplying the frequency of 0.6 kHz in the AM detected output.

The second intermediate frequency signal fif2 (b) is also fed to an amplitude limiting circuit 102 via the band pass filter circuit 101 (center frequency of 480 kHz), and is then fed to one input of a mixing circuit 103 after its amplitude value has been adjusted. In the mixing circuit 103, its input is mixed with the synchronized frequency signal of 1.8 kHz from the synthesizer circuit 91, and the mixed output is fed to one input of the synchronous detector circuit 105 via a band pass filter circuit 104 (center frequency of 478.2 kHz).

In the synchronous detector circuit 105, the second intermediate frequency signal fif2 (b) inputted from its one input is synchronously detected by the signal inputted from its another input (the mixing circuit 103). The output of the synchronous detector circuit 105 is fed to a low frequency amplifier circuit 107 via a band pass filter circuit 106 (center frequency of 1.8 kHz).

The output from the synchronous detector circuit 105, which is to be inputted to the low frequency amplifier circuit 107, has the characteristics of waveforms indicated by the solid lines, as shown in FIG. 11 (c). The original waveforms indicated by the dotted lines, which should have been outputted therefrom, are deformed by the delays in the rising parts of the waveforms. This also applies to the output from the low frequency amplifier circuit, as shown in FIG. 11 (d). To avoid this effect, it is constituted that the amplitudes of the waveforms in the latter half of each cycle (especially on and after the beginning of the last quarter) should be detected.

Further, although there will be a case wherein some changes in amplitudes remain in the output from the synchronous detector circuit 105 to be inputted to the low frequency amplifier circuit 107, the output from the low frequency amplifier circuit 107 is not only fed to a decoding circuit 110 but also automatically gain controlled by a peak detector circuit 108 and a comparator/amplifier circuit 109 as in the intermediate frequency amplifier circuit 95 such that its output is controlled so that the reference signal part has substantially a constant value. In the decoding circuit 110, the output (d) of the low frequency amplifier circuit 107 is converted to digital signals as shown in FIG. 11 (e), and then they are decoded to digital data as shown in FIG. 11 (f) so as to be outputted.

In this embodiment, the two inputs fed to the synchronous detector circuit 105 have been completely synchronized in terms of frequencies. The frequency signal of 1.8 kHz fed to one input of the mixing circuit 103 is synchronized with the signal detected by the AM detector circuit 98 or the like, and this signal is the clock signal itself used as a modulation signal in the transmitting side. Thus, for example, even if the clock signal has changed, it is completely synchronized with that change.

The second intermediate frequency signal fif2 of 480 kHz to be fed to another input of the mixing circuit 103 is naturally and completely synchronized in both frequency and phase with the second intermediate frequency signal fif2 directly fed to the synchronous detector circuit 105.

Thus, in the synchronous detector circuit 105, its original synchronous detection can be carried out with no chance of generating any error in frequency, and without being affected by any condition.

It is to say that, in the embodiment of this invention, when some errors generated in the synthesizer circuit 91 are contained in the first local oscillation signal fl1 and second local oscillation signal fl2, the transmitted digital signals can be decoded without having any bad influence on the operations of the synchronous detector circuit 105.

The synthesizer circuit 91 can be constituted as shown in FIG. 12 in accordance with the embodiment of this invention.

In FIG. 12, the oscillation frequency of a crystal control oscillation circuit 121 is controlled according to the capacitance of a variable capacity diode 123 connected in series to a condenser 122. A control voltage for the variable capacity diode 123 is provided such that a frequency divided output obtained by dividing the output frequency of the crystal control oscillation circuit 121 through a frequency divider circuit 124 (1/59,775) and a frequency signal (0.6 kHz) fed from the amplitude limiting circuit 100 of FIG. 10 are compared in a phase comparator circuit 125, and the comparator output is fed through a low pass filter circuit 126. As the result of this PLL control, the oscillation frequency fs of the crystal control oscillation circuit 121 is adjusted, correspondingly to the phase comparator input of 0.6 kHz, to fs=35,865 MHz.

The frequency divider circuit 124 has also a frequency divided output of 1/19,925, and a frequency signal of 1.8 kHz, the frequency divided output, is fed to the mixing circuit 103 of FIG. 10.

The oscillation frequency fs of the crystal control oscillation circuit 121 is also divided by a frequency divider circuit 127 (a dividing ratio of 1/35,865) into a frequency signal of 1 kHz. The frequency signal of 1 kHz is used as a comparator reference signal for a PLL control circuit comprising a voltage control oscillation circuit 131a, a frequency divider circuit 132a (a dividing ratio of 1/70,000), a phase comparator circuit 133a, and a low frequency filter circuit 134a so as to form a frequency signal of 70 MHz. This signal is outputted through a buffer amplifier circuit 135a as the second local signal frequency fl2 (=70 MHz) to the mixing circuit 93 of FIG. 10.

Similarly, the frequency signal of 1 kHz is used as a comparator reference signal for a PLL control circuit comprising a variable frequency divider circuit 132b of which dividing ratio is variably controlled by signals from a voltage control oscillation circuit 131b and a designated channel control circuit 136, a phase comparator circuit 133b, and a low frequency filter circuit 134b so as to form a frequency of 48.48 MHz. This signal is outputted through a buffer amplifier circuit 135b as the first local signal frequency fl1 (=48.48 MHz) to the mixing circuit 86 of FIG. 10.

The synthesizer circuit 61 (FIG. 7) for use in the radio apparatus in the transmitting side is used in a synthesizer circuit of FIG. 12 such that the control voltage of the crystal control oscillation circuit is kept constant and oscillation frequency fs is adjusted to be 35.865 MHz. Further, a frequency divider circuit (dividing ratio of 1/75) may further be disposed to form a frequency signal of 478.2 kHz used as a modulation circuit RF signal.

Figure 13:
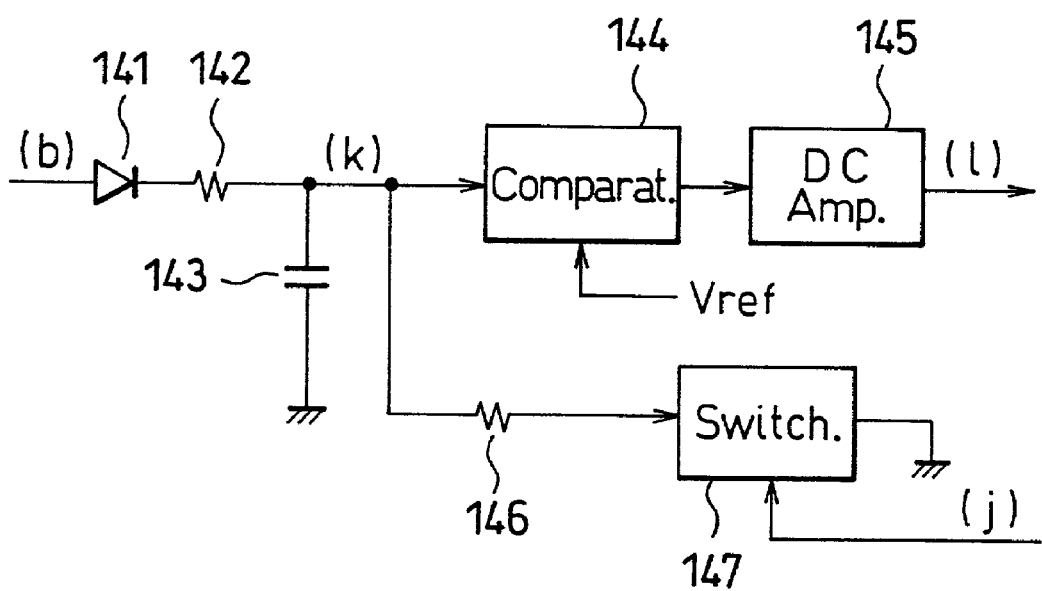
FIG. 13 is a block diagram showing the specific structure of a peak detector circuit and a comparator/amplifier circuit in the receiving side of the radio apparatus of the SSB radio communication system of this invention.
Figure 14:
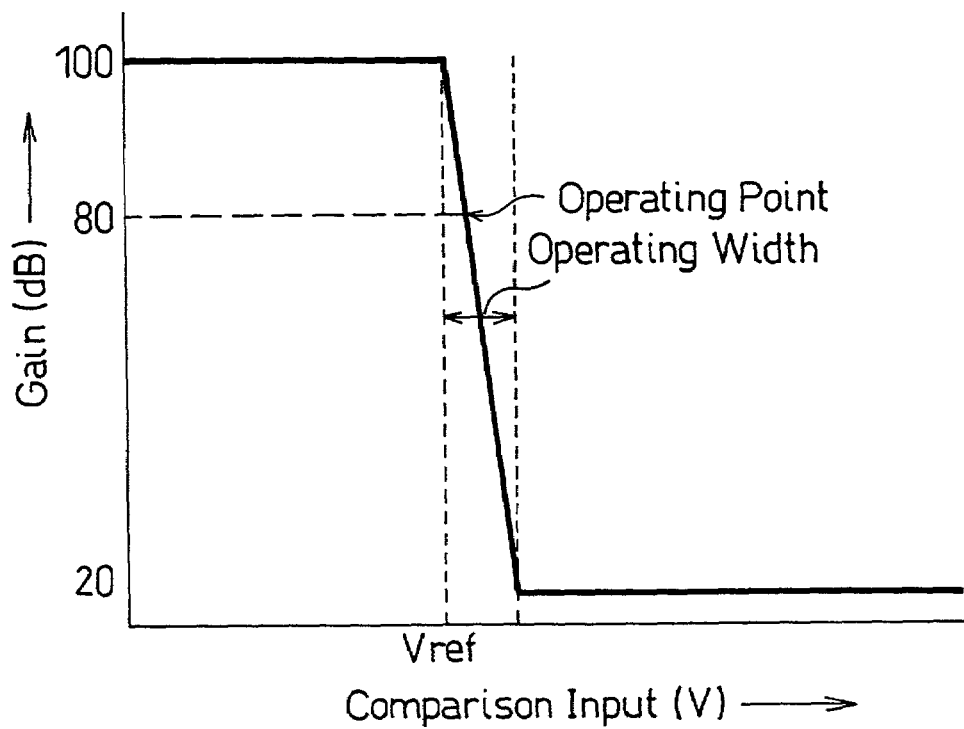
FIG. 14 is a diagram showing the operating characteristics of the circuits of FIG. 13.

FIG. 13 is a block diagram showing the specific structure of a peak detector circuit and a comparator/amplifier circuit in the receiving side of the radio apparatus of the SSB radio communication system of this invention, FIG. 14 shows the operating characteristics of the circuits of FIG. 13, and FIG. 15 shows the waveforms of signals in each part of FIG. 13.

In general, a peak detector circuit is constituted such that a condenser is charged so that an peak input signal is obtained, and when the input signal is less than the charged peak value, the load of the condenser is discharged through a discharge resistor. Since in this case, a discharge time constant is much larger than a charge time constant (for example, 100 times), when the levels of received signals change greatly by fading or the like, the detected peak value can not follow the change so that automatic gain control is unable to function adequately.

The peak detector circuit and comparator/amplifier circuit of FIG. 13 is constituted such that even in such a case they can follow the actual peak value. It will be explained a case wherein they are applied to a peak detector circuit 96 and a comparator/amplifier circuit 97 shown in FIG. 10.

Referring to FIGS. 13–15, the output of the intermediate frequency amplifier circuit 95 is inputted as the input signal (b), the input signal (b) is rectified by a diode 141 and passed through a charging resistor 142 to charge a condenser 143, the charging voltage (k) is fed to a comparator circuit 144 of a reference value Vref, and the result of the comparator is given to a DC amplifier circuit 145. This comparator circuit 144 may be constituted by a differential amplifier. A clock signal (a) is 1.8 kHz.

FIG. 14 shows comparator input versus gain characteristics of a comparator/amplifier circuit comprising the comparator circuit 144 and the DC amplifier circuit 145. When the charging voltage (k) is lower than the reference value Vref, the gain becomes a high constant value (100 dB), and when the charging voltage (k) exceeds the reference value Vref, the gain decreases rapidly, and the charging voltage (k) is large, the gain becomes a low constant value (20 dB). An AGC voltage (l) is fed to the intermediate frequency amplifier circuit 95 as a gain control signal.

The charged voltage (k) of the condenser 143 is discharged through a discharge resistor 146 during a switching circuit 147 is on. The on and off operation of the switching circuit 147 is controlled by a discharge control signal (j).

The charging voltage (k) of the condenser 143 is fed according to the input signal (b) to the comparator circuit 144 so as to be compared with the reference value Vref. When the charging voltage (k) exceeds the reference value Vref, the gain decreases greatly, the level of the input signal (b) decreases according to the decrease of the gain, and an operating point of a level is fixed according to the level of the input signal (b) as shown in FIG. 14. When the charging voltage (k) is constant, there is no change in gain.

The discharge control signal (j) for controlling the on and off operation of the switching circuit 147 is switched on during the period of the reference signal S, and is switched off during the period of data signal is 0 or 1. More specifically, it is switched on at a point of time when the amplitude level for the reference signal S has almost risen (for example, at a mid point during the period of the reference signal), the on state is kept until just before the end of the period of the reference signal, and then it is switched off. The discharge control signal (j) is formed in the synthesizer circuit 91.

At a point of time when the discharge circuit is being formed by switching on the switching circuit 147, the load that has been charged in the condenser 143 up to the point of time is discharged if the input voltage (b) is lower than the charging voltage (k). At this time, the charge voltage of the condenser 143 is momentarily decreases. After that, the condenser 143 is charged according to the input voltage. Although at this time the discharge circuit is switched on, the charge current is created so greatly higher than the discharge current in the vicinity of the peak value of the reference signal S that the charge current prevails so that no error in the peak value of the reference signal is generated.

Next, the discharge circuit is broken by switching off the switching circuit 147 at a point of time when the peak value of the reference signal is over. Since the point of peak is over and the discharge circuit is switched off, the peak value of the condenser 143 is kept constant and the AGC voltage (l) is thus kept constant during the following period of data signals.

During the period of the reference signal, the switching circuit 147 is switched on again to form the discharge circuit. The same control is repeated hereafter.

Since the AGC voltage is created based on the input signal (b) during the period of the reference signal by conducting the discharge control, and since the AGC voltage is kept constant during the period of data signals, appropriate control of gain can be achieved.

Further, the discharge circuit is switched on shortly before the peak value of the reference signal has arrived, when the input signal (b) changes greatly by fading or the like, especially when it becomes smaller, the charge voltage (k) of the condenser 143 is renewed so that it always corresponds to a new input signal (b). Thus, the gain is rapidly controlled in response to the changes of input signals (b).

When the received signal (a) is suffered from fading, some residual changes may be found in the level of input signals (b) inputted to the synchronous detector circuit 105, as shown in FIG. 15 (b). In this case, such changes in level can be removed by adopting a peak detector circuit having the discharge control circuit similar to the one mentioned above in the gain control circuit of the low frequency amplifier circuit 107.

Referring to some specific numerical examples, a frequency of 4.8 kHz is created for modulating signals comprising a reference signal and data signals, and a width of 2.4 kHz is set for a pass band (when the width of the pass band is 2.4 kHz, it is created such that the upper side band is placed at a higher frequency by 1.2 kHz from the center frequency of the pass band). When the number of data signals between the reference signals are two and the number of multi-values are eight, the data transmission speed is calculated as follow:

4.8 (kHz)×2/3 (number of data signals)×3 (multi-values $8=2^3$)=9.6 kbps Thus, a high speed of data transmission is possible with such a narrow width of band.

What is claimed is:

1. An SSB radio communication system comprising:
   amplitude modulating a carrier wave in a transmitting side by using modulation inputs, wherein the modulation inputs comprise a constant amplitude, sine wave shaped reference pulse signal having a predetermined width and period, and sine wave shaped modulation pulse signals having the same width as the reference pulse signal and amplitudes representing two- or multi-value digital values based on the amplitude of the reference pulse signal, transmitting the amplitude modulated signals on a single side band, and automatically adjusting gains of received signals in a receiving side which are values of peaks of the received signals based on the reference pulse signal, wherein forming the period or frequency of said reference pulse signal in the transmitting side in synchronism with the carrier wave frequency, and determining a local carrier frequency in the receiving side, based on the period or frequency of said reference pulse signal, wherein said reference pulse signal is formed such that the reference pulse signal is provided with a predetermined width and a predetermined period based on said carrier wave frequency of the transmitting side.

2. A radio apparatus comprising:

a transmitting circuit for single side band communications, and means for generating modulation inputs, wherein said modulation inputs comprise a constant amplitude, sine wave shaped reference pulse signal having a predetermined width and period, and sine wave shaped modulation pulse signals having the same width as the reference pulse signal and amplitudes representing two- or multi-value digital values based on the amplitude of the reference pulse signal, wherein said modulation inputs generated by the generating means are supplied to the transmitting circuit so as to amplitude modulate a carrier wave to transmit the amplitude modulated signals through a single side band, wherein said reference pulse signal is formed such that the reference pulse signal is provided with a predetermined width and a predetermined period based on said carrier wave frequency of the transmitting circuit.

3. A radio apparatus comprising:

an intermediate frequency amplifier for receiving communication signals carried on a single side band, and for automatically controlling the gain of the received signals, a demodulator for demodulating the received signals based on a local carrier wave frequency, and gain control means for automatically control the gain of said intermediate frequency amplifier such that a sine wave shaped reference pulse signal, which is contained in the output signals of said intermediate frequency amplifier, and which has a predetermined width and a predetermined period, is peak detected so that its peak value becomes a predetermined value, wherein said reference pulse signal which is contained in the output signals of said intermediate frequency amplifier is peak detected to extract a row of constant period pulse signals, and wherein said local carrier wave frequency is adjusted based on said row of constant period pulse signals, wherein said reference pulse signal is formed such that the reference pulse signal is provided with a predetermined width and a predetermined period based on said carrier wave frequency.

4. A radio apparatus of claim 3, further comprising a low frequency amplifier disposed in the latter stage of said demodulator, wherein the gain of said low frequency amplifier is controlled by the automatic gain control means based on said reference pulse signal contained in the output signals of said low frequency amplifier.

5. A radio apparatus for receiving single side band communication signals modulated by modulation inputs, wherein said modulation inputs comprise a constant amplitude, sine wave shaped reference pulse signal, formed based on a carrier frequency, having a predetermined width and a predetermined period, and sine wave shaped modulation pulse signals having the same width as the reference pulse signal and amplitudes representing two- or multi-value digital values based on the amplitude of the reference pulse signal, the apparatus comprising, an intermediate frequency amplifier for automatically control the gain of the modulated signals, a demodulator for demodulating the received signals, automatic gain control means for peak detecting said reference pulse signal contained in the output signals of said intermediate frequency amplifier, and for controlling the gain of said intermediate frequency amplifier so that its peak value becomes a predetermined value, wherein the output of said intermediate frequency amplifier is amplitude detected by a amplitude detector means to extract a frequency component of the predetermined period of said reference pulse signal, the frequency obtained based on the frequency obtained by said amplitude detector means is mixed with the frequency of the output signal of said intermediate frequency amplifier, and the frequency representing the sum or difference therebetween is fed to said demodulator as a local carrier frequency wave.

6. A radio apparatus of claim 5, further comprising a condenser having a charging/discharging circuit to control the gain of said intermediate frequency amplifier according to a charging voltage, wherein said discharging circuit of the condenser is switched on during a period when the amplitude of said reference pulse signal increases, and switched off during at least a period of the modulation pulse signal.

* * * * *

UNITED STATES PATENT AND TRADEMARK OFFICE
CERTIFICATE OF CORRECTION

PATENT NO.         : 7,120,397 B2                                        Page 1 of 1
APPLICATION NO. : 09/934870
DATED              : October 10, 2006
INVENTOR(S)       : Makishima et al.

It is certified that error appears in the above-identified patent and that said Letters Patent is hereby corrected as shown below:

On title page Item (12), delete "Tatemori et al." and insert -- Makishima et al. --.

On title page Item (75), change the order of the listed inventors from

"Masaki Tatemori, Setagaya-ku (JP); Yoji Makishima, 4-8-10, Higashi-cho, Nishi-tokyo-shi, 202-0012 (JP)"
to
-- Yoji Makishima, 4-8-10, Higashi-cho, Nishi-tokyo-shi, 202-0012 (JP)
Masaki Tatemori, Setagaya-ku (JP) --.

Signed and Sealed this

Seventh Day of August, 2007

JON W. DUDAS
*Director of the United States Patent and Trademark Office*